(12) United States Patent
Fujishima et al.

(10) Patent No.: US 7,187,733 B2
(45) Date of Patent: Mar. 6, 2007

(54) HIGH-FREQUENCY SIGNAL RECEIVER

(75) Inventors: Akira Fujishima, Aichi (JP); Kenji Adachi, Aichi (JP); Hirotoshi Takeuchi, Gifu (JP); Yasuo Oba, Shiga (JP); Ippei Kanno, Kyoto (JP); Hiroaki Ozeki, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 807 days.

(21) Appl. No.: 10/413,652

(22) Filed: Apr. 15, 2003

(65) Prior Publication Data

US 2004/0017866 A1 Jan. 29, 2004

(30) Foreign Application Priority Data

| Apr. 16, 2002 | (JP) | ............................. 2002-113009 |
| May 20, 2002 | (JP) | ............................. 2002-144236 |
| Dec. 19, 2002 | (JP) | ............................. 2002-367964 |

(51) Int. Cl.
*H04L 27/08* (2006.01)
(52) U.S. Cl. ................... 375/345; 375/316; 455/234.1
(58) Field of Classification Search ............... 375/345; 330/129; 455/234.1
See application file for complete search history.

(56) References Cited

U.S. PATENT DOCUMENTS 4,776,040 A * 10/1988 Ichikawa et al. ........... 455/315
5,408,698 A * 4/1995 Serizawa et al. ........ 455/245.1
6,226,504 B1 * 5/2001 Takagi ..................... 455/234.1
6,657,678 B1 * 12/2003 Mizukami et al. .......... 348/726

FOREIGN PATENT DOCUMENTS

| DE | 199 10 371 A | 9/1999 |
| EP | 0 464 792 A | 1/1992 |
| EP | 0 913 934 A | 5/1999 |
| JP | 08-288879 | 11/1996 |
| JP | 08288879 A * | 11/1996 |

OTHER PUBLICATIONS

European Search Report for EP 03 00 8490, dated Apr. 13, 2005.

* cited by examiner

*Primary Examiner*—Temesghen Ghebretinsae
*Assistant Examiner*—Juan Alberto Torres
(74) *Attorney, Agent, or Firm*—RatnerPrestia

(57) ABSTRACT

A high-frequency signal receiver includes a variable gain amplifier for amplifying a high frequency signal input thereto, a local oscillator, a mixer for mixing a signal output from the variable gain amplifier and a signal output from the local oscillator, a filter for receiving a signal output from the mixer, a gain controller for outputting a voltage according to the signal output from the mixer; and a weighting circuit for weighting and summing a control voltage and the signal output from the gain controller for controlling the gain of the variable gain amplifier. The high-frequency signal receiver hence creates a small amount of signal error even when the input signal includes a large interference signal adjacent to a desired signal.

19 Claims, 8 Drawing Sheets

HIGH-FREQUENCY SIGNAL RECEIVER

FIELD OF THE INVENTION

The present invention relates to a high-frequency signal receiver for receiving high-frequency signals.

BACKGROUND OF THE INVENTION

FIG. 10 illustrates a conventional high-frequency signal receiver. A high-frequency signal is received at an input port 601 and transferred to an automatic gain control (AGC) circuit 602, a variable gain amplifier for controlling the level, the amplitude, of the signal. A mixer 605 receives a signal output from the AGC circuit 602 and a signal output from a local oscillator 604. A signal output from the mixer 605 is transferred to a filter 607. An AGC controller 606 controls a gain of the AGC circuit 602 through a gain control port 603 according to a signal output from the mixer 605. A signal output from the filter 607 is transferred to an AGC circuit 608. A mixer 610 receives a signal output from the AGC circuit 608 and a signal output from a local oscillator 609. A signal output from the mixer 610 is transferred to a filter 612. An AGC controller 611 controls a gain of the AGC circuit 608 according to a signal output from the filter 612. A signal output from the filter 612 is transferred to an AGC circuit 613. A signal output from the AGC circuit 613 is received by an AD converter 614, and a signal output from the AD converter 614 is transferred to a digital filter 615. A signal output from the digital filter 615 is transferred to a demodulator 617. A signal output from the demodulator 617 is output through an output port 618. An AGC controller 616 controls a gain of the AGC circuit 613 according to a signal output from the digital filter 615.

An operation of the conventional high-frequency receiver having the above arrangement will be explained. It is assumed that a first intermediate frequency output from the mixer 605 is higher, than the frequency of the input signal, and a second intermediate frequency output from the mixer 610 is lower than the frequency of the input signal.

A high frequency signal, for example, digitally modulated ranging from 90 MHz to 770 MHz is input to the input port 601. The input signal is then amplified by the AGC circuit 602 and transferred to the mixer 605 for mixing the signal and a signal output from the local oscillator 604 to produce a signal at a first intermediate frequency, e.g. 1200 MHz. The signal at the first intermediate frequency is then received by the AGC controller 606. A voltage output from the AGC controller 606 is fed to the AGC circuit 602 for controlling the gain of the AGC circuit 602 for maintaining the level of the signal output from the mixer 605 in constant.

The high frequency signal output from the mixer 605 has an undesired signal suppressed by the filter 607, is amplified by the AGC circuit 608, and is transferred to the mixer 610 for mixing the signal and a signal output from the local oscillator 609 to produce a signal at the second intermediate frequency, e.g. 4 MHz.

The signal of 4 MHz output from the mixer 610 has an undesired signal suppressed by the filter 612, and is received by the AGC controller 611. A voltage output from the AGC controller 611 is fed to the AGC circuit 608 for controlling the gain of the AGC circuit 608 for maintaining the level of the signal output from the mixer 610 in constant.

The signal at the second intermediate frequency output from the filter 612 is amplified by the AGC circuit 613 and is converted into a digital signal by an analog/digital (A/D) converter 614. The digital signal has an undesired signal suppressed by the digital filter 615 and is demodulated by the demodulator 617, thus being output from the output port 618.

The signal output from the digital filter 615 is received by the AGC controller 616. A voltage output from the AGC controller 616 is fed to the AGC circuit 613 for controlling the gain of the AGC circuit 613 for maintaining the level of the signal to be received by the demodulator 617 in constant.

Specifically, the gains of the AGC circuits 602, 608; and 613 are determined according to the level of the input signal received at the input port 601. This arrangement provides the signal output finally at a good carrier-to-noise (C/N) ratio and a reduced distortion which may be caused by interference signals adjacent in frequency to the output signal. The noise factor (F) of the high-frequency signal receiver is expressed as:

$$F = F_1 + \frac{F_2 - 1}{G_1} + \frac{F_3 - 1}{G_1 \cdot G_2} + \ldots \quad \text{(Equation 1)}$$

where
F. A noise factor of the AGC circuit 602.
"$G_1$: The gain of the AGC circuit 602, $F_2$: A noise factor of the mixer 605, $G_2$: A total gain of the mixer 605 and the filter 607, and $F_3$: A noise factor of succeeding circuits including the AGC circuit 608"

The C/N ratio of the high-frequency signal receiver is expressed as $$\frac{C}{N} = \frac{Psi}{kTB(F-1)} \quad \text{(Equation 2)}$$

where
Psi: The level of the desired signal (W),
k: The Boltzmann constant, $1.38 \times 10^{-23}$ (J/K),
T: An ambient temperature (K), and
B: A frequency range of the desired signal (Hz).

Equation 2 indicates that the C/N ratio of the high-frequency signal receiver is determined by the level (Psi) of the desired signal and the noise factor (F).

For example, the AGC controllers 606, 611, and 616 are preset to control the gain of the AGC circuit 602 when the level of the high frequency signal received at the input port 601 is larger than −70 dBm, and to control the gain of the AGC circuit 608 when the level is not larger than −70 dBm.

The C/N ratio of the high-frequency signal receiver will be explained when the input signal contains only the desired signal or contains the signal and a small adjacent signal adjacent to the desired signal. Such interfering signals adjacent to the desired signal are classified into the adjacent signal and an adjacent-adjacent signal. The following description is based on the adjacent signal.

When the level of the adjacent signal is smaller than the level of the desired signal, the gain is controlled according substantially only to the desired signal.

FIG. 3 illustrates the noise factor F of the high-frequency signal receiver against the level of the input signal. When the level the desired signal of the high-frequency signal stays in a range 301, not larger than −70 dBm, the gain $G_1$ of the AGC circuit 602 is at its maximum as calculated by equation 1. Accordingly, the noise factor F is determined by the noise factor $F_1$ of the AGC circuit 602 and remains low as a curve 305. Then, when the level of the desired signal shifts into a range 302, larger than −70 dBm, the gain $G_1$ of the AGC circuit 602 is controlled to shift lower. The noise factor $F_2$ of the mixer 605 and the noise factor $F_3$ of the succeeding circuits including the filter 607 do not become negligible accordingly, and therefore, the noise factor F of the high-frequency signal receiver significantly increases as a curve 303.

FIG. 4 illustrates the C/N ratio of the high-frequency signal receiver in relation to the level of the desired signal. When the desired signal is in a range 401, not larger than −70 dBm, the noise factor 303 remaining in constant throughout the range 301, as shown in FIG. 3 while the level (Psi) of the desired signal increases. Accordingly, the C/N ratio defined by equation 2 increases according to the level (Psi) of the desired signal as a curve 405. When the desired signal stays in a range 402, larger than −70 dBm, the noise factor F of the high-frequency signal receiver increases substantially in proportion to the signal level (Psi) of the desired signal, as shown throughout the range 302 in FIG. 3, and the C/N ratio defined by equation 2 remains in constant as shown by a line 403.

The C/N ratio of the high-frequency signal receiver will be explained when the level of the adjacent signal is larger than that of the desired signal.

FIG. 5 illustrates the C/N ratio of the high-frequency signal in relation to the level of the adjacent signal while the level (Psi) of the desired signal remains in constant at −70 dBm. When the level of the adjacent signal is in a range 501, smaller than −70 dBm, the noise factor F of the high-frequency signal receiver is small, as shown by the line 304 in FIG. 3, since the gain is controlled by the level of −70 dBm of the desired signal. Accordingly, the C/N ratio defined by equation 2 stays in constant, as shown by a line 504 in FIG. 5.

In the case that when the desired signal has the level of −70 dBm, when the adjacent signal shifts into a range 502, larger than −70 dBm, as shown in FIG. 5, the noise factor F of the high-frequency signal receiver increases substantially in proportion to the signal level (Psi) of the input signal, as shown in FIG. 3, and the level (Psi) of the desired signal remaining in constant at −70 dBm. This allows the C/N ratio defined by equation 2 to decrease and decline according to an increase of the level of the adjacent signal. Accordingly, the C/N ratio gradually declines, as shown by the line 503, in reverse proportion to the level of the adjacent signal.

The adjacent signal deteriorates the C/N ratio according to the level of the signal, and generates a three-dimensional inter-modulation distortion (referred to as IM3 hereinafter). The deteriorating for the C/N ratio affects the receiver more than the distortion.

Under the condition that the level of the adjacent signal is larger than that of the desired signal of the input signal, the gain of the AGC circuit 602 can be controlled to be lower according an increase of the level of the adjacent signal. As the result, the C/N ratio of the high-frequency signal receiver declines, thus increasing a bit error rate (BER) and interrupting the reception of the desired signal.

A conventional mixer for suppressing an image interference disclosed in Japanese Patent Laid-Open Publication No. 8-288879 prevents the receiver from receiving the desired signal of the input signal when an interference component adjacent to the desired signal has a level, e.g. 20 dBm, larger than the level (Psi) of the desired signal.

Alternatively, a microcomputer may measure the C/N ratio or the bit error rate at the demodulator 617 to control the gain of the AGC circuit 602 with the measured ratio or rate for reducing an influence of the adjacent signal. However, This controlling operation takes a considerably-long time, thus being unfavorable particularly for receiving a signal while a condition of the received signal changes in time, for example, during moving.

SUMMARY OF THE INVENTION

A high-frequency signal receiver includes a variable gain amplifier for amplifying a high frequency signal input thereto, a local oscillator, a mixer for mixing a signal output from the variable gain amplifier and a signal output from the local oscillator, a filter for receiving a signal output from the mixer, a gain controller for outputting a voltage according to the signal output from the mixer; and a weighting circuit for weighting and summing a control voltage and the signal output from the gain controller for controlling the gain of the variable gain amplifier.

The high-frequency signal receiver hence creates a small amount of signal error even when the input signal includes a large interference signal adjacent to a desired signal.

DETAILED DESCRIPTION OF THE PREFERRED EMBODIMENTS

Embodiment 1

Figure 1:
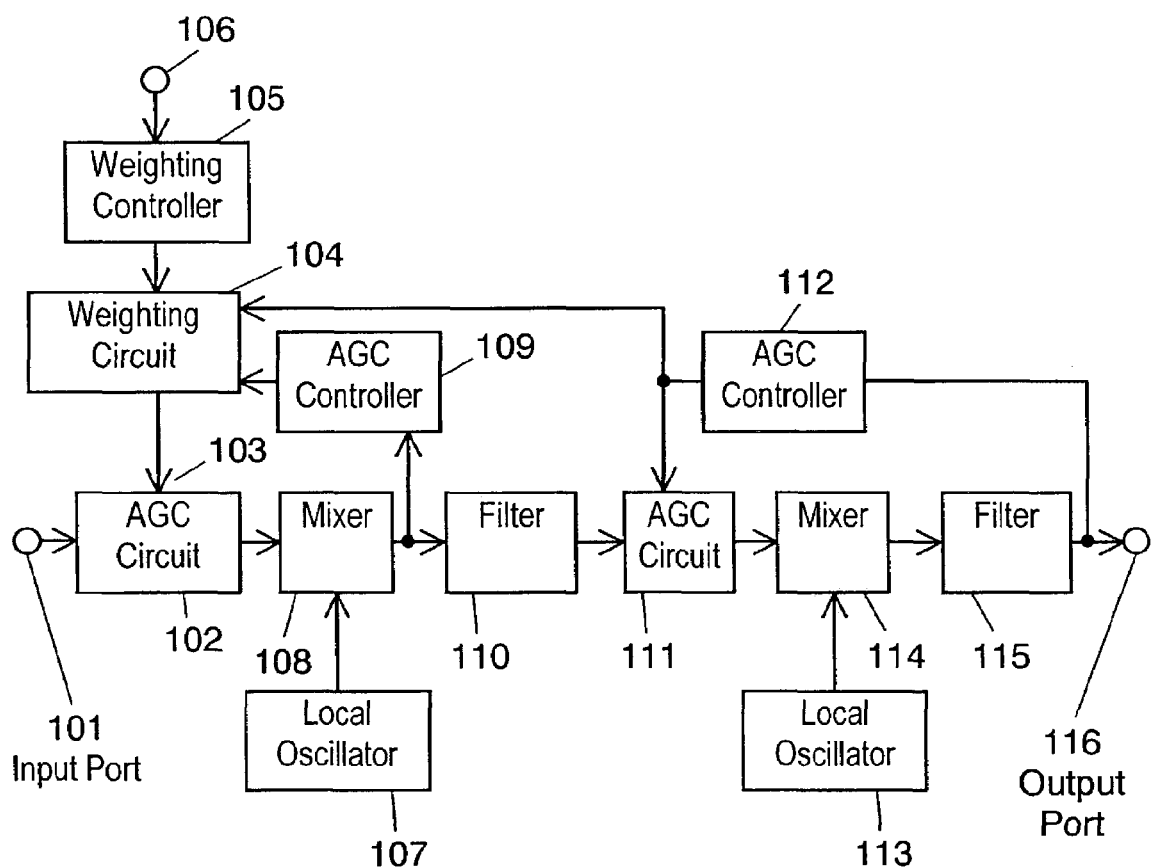
FIG. 1 is a block diagram of a high-frequency signal receiver according to exemplary embodiment 1 of the present invention.

FIG. 1 is a block diagram of a high-frequency signal receiver according to exemplary embodiment 1 of the present invention. As an interference signal adjacent to a desire signal in an input signal may include an adjacent signal and an adjacent-adjacent signal, the following description is based on the adjacent signal.

A high-frequency signal is received at an input port 101 and transferred to an automatic gain control (AGC) circuit 102 which acts as a variable gain amplifier having a controllable gain for controlling the level of the signal. A mixer 108 receives a signal output from the AGC circuit 102 and a signal output from a local oscillator 107. An output signal from the mixer 108 is fed to a filter 110. The signal output from the mixer 108 is received by an AGC controller 109. A signal output from the filter 110 is transferred to an AGC circuit 111. A mixer 114 receives a signal output from the AGC circuit 111 and a signal output from a local oscillator 113. A filter 115 receives a signal output from the mixer 114 and outputs signal through an output port 116. The signal output from the filter 115 is fed to an AGC controller 112 controlling the gain of the AGC circuit 111 according to the fed signal. A weighting circuit 104 receives respective voltages output from the AGC controllers 109 and 112 and outputs a voltage to a gain control port 103 for controlling the gain of the AGC circuit 102. A weighting controller 105 is arranged responsive to control data from a data input port 106 for outputting a voltage to the weighting circuit 104.

In the high-frequency signal receiver according to embodiment 1, a first intermediate frequency output from the mixer 108 is higher than the frequency of the input signal received at the input port 101, and a second intermediate frequency is lower than the frequency of the input signal.

The voltages output from the AGC controller 109, the AGC controller 112, the weighting circuit 104, and the weighting controller 105 may be replaced by currents or digital signals.

When the level of the high-frequency signal received at the input port 101 is larger than, e.g. −70 dBm, the gain of the AGC circuit 102 is controlled. When the level is not larger than −70 dBm, the gain of the AGC circuit 111 is controlled.

The high-frequency received at the input port 101 ranges from 90 MHz to 770 MHz. The high-frequency signal is amplified by the AGC circuit 102 and transferred to the mixer 108 for mixing the signal and a signal output from the local oscillator 107 to produce a signal at the first intermediate frequency, e.g., 1200 MHz. A signal output from the mixer 108 is then received by the AGC controller 109. The signal output from the mixer 108 includes signals other than a desired signal that are suppressed by the filter 110. Since the output signal has as a high frequency, 1200 MHz, signals adjacent to the output signal may not be suppressed sufficiently. For example, an audio signal at a lower channel is suppressed just by about 5 to 10 dB.

The signal output from the filter 110 is amplified by the AGC circuit 111 and transferred to the mixer 114 for mixing the signal and an oscillation signal output from the local oscillator 113 to produce a signal at the second intermediate frequency, e.g. 4 MHz. Signals other than the desired signal in the signal are suppressed by the filter 115. The AGC controller 112 controls the gain of the AGC circuit 111 for maintaining the level of a signal output from the filter 115 in constant. The filter 115 outputs a signal through the output port 116. If being designed for suppressing the audio signal at the lower channel of the adjacent signal by 20 dB, the filter 115 can suppress the audio signal by about 25 dB in combination with the filter 110. More specifically, when the level of the adjacent signal is 25 dB greater than that of the desired signal, the adjacent signal having the level greater than that of the desired signal is output from the output port 116.

Respective voltages output from the AGC controllers 109 and 112 are transferred to the weighting circuit 104 for multiplying the voltage by respective weighting factors and summing the multiplied voltages. An output from the weighting circuit 104 controls the gain of the AGC circuit 102 via the gain control port 103 for maintaining the signal output from the mixer 108 in constant.

Control data received at the data input port 106 is transferred via the weighting controller 105 to the weighting circuit 104 for independently determining the weighting factors of the weighting circuit 104. That is, the weighting operation for the level of the interference signal (corresponding to the signal output from the AGC controller 109) and the level of the desired signal (corresponding to the signal output from the AGC controller 112) are appropriately determined, thus changing the level of the signal output from the mixer 108 appropriately. A noise factor (F) of the high-frequency signal receiver is expressed as:

$$F = F_1 + \frac{F_2 - 1}{G_1} + \frac{F_3 - 1}{G_1 \cdot G_2} + \ldots \qquad \text{(Equation 3)}$$

where
  $F_1$: A noise factor of the AGC circuit 102,
  "$G_1$: The gain of the AGC circuit 102, $F_2$: A noise factor of the mixer 108, $G_2$: A total gain of the mixer 108 and the filter 110, and $F_3$: A noise factor of succeeding circuits including the AGC circuit 111"

A carrier-to-noise (C/N) ratio of the high-frequency signal receiver is expressed as $$\frac{C}{N} = \frac{Psi}{kTB(F-1)} \qquad \text{(Equation 4)}$$

where
  Psi: The level of the desired signal (W),
  k: The Boltzmann constant, $1.38 \times 10^{-23}$ (J/K),
  T: An ambient temperature (K), and
  B: A frequency range of the desired signal (Hz).

The voltage V(RF12) output from the weighting circuit 104 is expressed as:

$$V(RF12) = K1 \times V(AGC1) + K2 \times V(AGC2) \qquad \text{(Equation 5)}$$

where
  V(AGC1): The voltage output from the AGC controller 109,
  K1: The weighting factor for the voltage V(AGC1) in the weighting circuit 104,
  V(AGC2): The voltage output from the AGC controller 112, and
  K2: The weighting factor for the voltage V(AGC2) in the weighting circuit 104.

The voltage V(AGC1) output from the AGC controller 109, which receives both the desired signal and the adjacent signal, and the voltage V(AGC2) output from the AGC controller 112, which receives the desired signal and the adjacent signal suppressed by the filter 115, are weighted independently. This operation enables respective contribution rates of the voltages to the signal output from the mixer 108 to be dependently determined.

It is assumed that the voltage V(AGC1) from the AGC controller 109, the voltage V(AGC2) from the AGC controller 112, and the voltage V(RF12) from the weighting circuit 104 to be 3V provide maximum gains, and that the voltages to be 0V provide minimum gains. The weighting factors K1 and K2 may be determined in a range from 0 to 1. Referring to equation 5, the case that the weighting factor K1 is 1, and that the weighting factor K2 is any desired value will be explained.

According to embodiment 1, when the high-frequency signal received at the input port 101 exceeds −70 dBm, the gain of the AGC circuit 102 is controlled. When the signal is lower than −70 dBm, the gain of the AGC circuit 111 is controlled.

First, it is assumed that the input signal contains the desired signal having the level (Psi) or contains the desired signal and a signal having a level smaller than the level (Psi) adjacent to the desired signal. The C/N ratio of the high-frequency signal receiver will be explained when the level (PSI) of the desired signal is not higher than −70 dBm.

Since the level (Psi) of the desired signal is not higher than −70 dBm, the voltage V(AGC1) output from the AGC controller 109 is set to 3V in order to provides the maximum gain. The voltage V(RF12) output from the weighting circuit 104 does not exceed 3V, while the voltage V(AGC2) output from the AGC controller 112, which corresponds to the second term in equation 5, ranges from 0V to 3V. Thus, the voltage V(RF12) from the weighting circuit 104 is set to 3V, and the gain of the AGC circuit 102 is determined by the voltage V(AGC1) output from the AGC controller 109 similarly to the conventional receiver.

Figure 3:
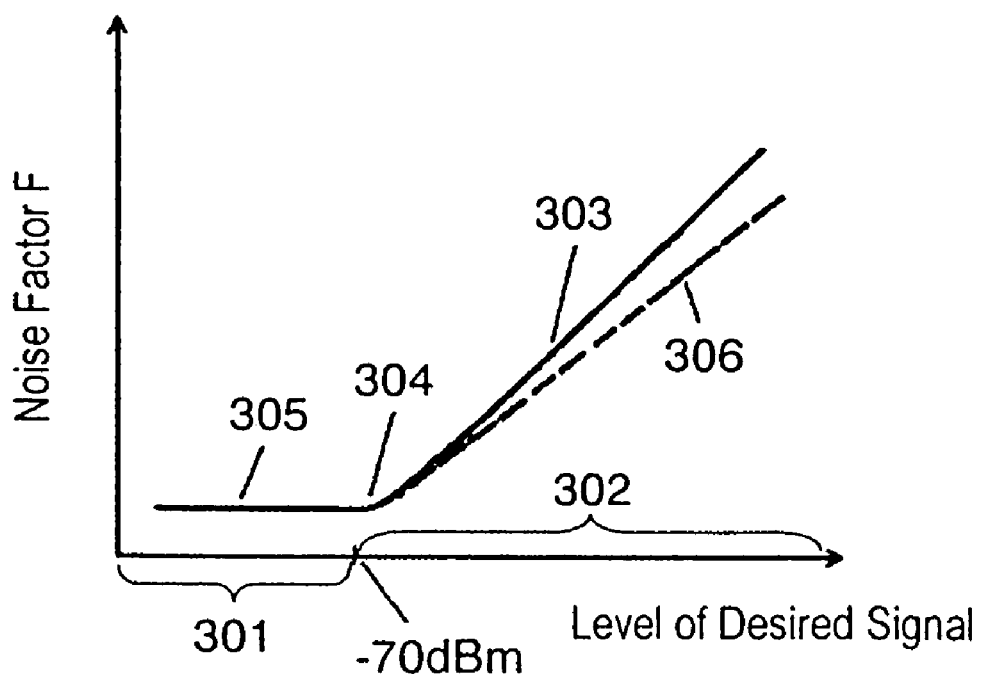
FIG. 3 illustrates a noise factor of the high-frequency signal receiver in relation to the level of a desired signal.

FIG. 3 illustrates the noise factor (F) of the high-frequency signal receiver in relation to the level of the desired signal. A horizontal axis represents the level of the desired signal, while a vertical axis represents the noise factor (dB) of the high-frequency signal receiver. When the level (Psi) of the desired signal stays in a range 301, not higher than −70 dBm, the AGC circuit 102 has the maximum gain in equation 3, and thus, the noise factor ($F_1$) contribute to the noise factor (F). Accordingly, the noise factor (F) of the receiver remains small and constant as expressed by a line 305.

Figure 4:
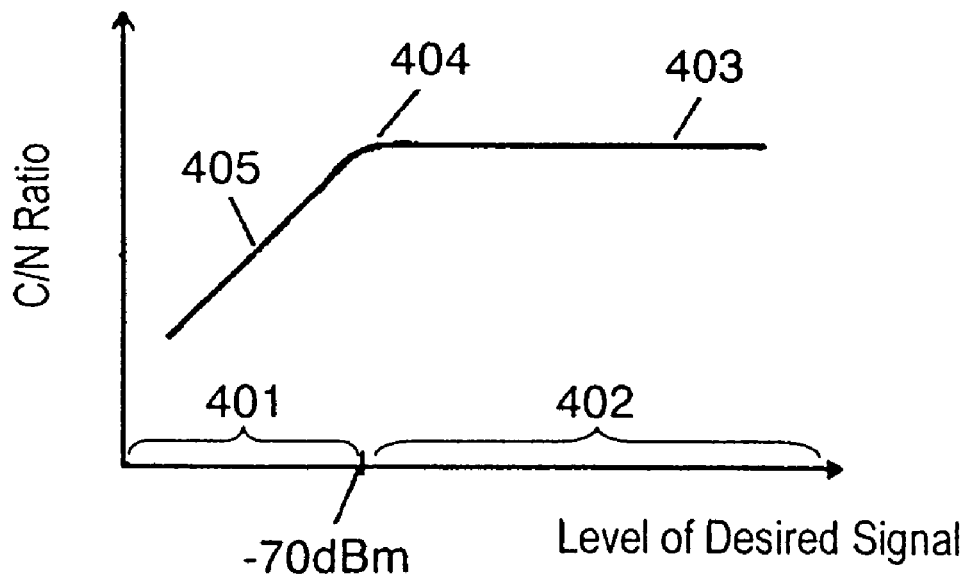
FIG. 4 illustrates a C/N ratio of the high-frequency signal receiver in relation to the level of a desired signal.

FIG. 4 illustrates the C/N ratio of the high-frequency signal receiver in relation to the level (Psi) of the desired signal. A horizontal axis represents the level of the desired signal, while a vertical axis represents the C/N ratio of the high-frequency signal receiver. When the level (Psi) of the desired signal stays in a range 401, not higher than −70 dBm, the C/N ratio expressed as equation 4 increases, i.e., is getting better according to an increase of the level (Psi) of the desired signal as shown by a line 405 in FIG. 4 since the noise factor (F) remains small and constant as shown by the line 305 in FIG. 3

Next, the C/N ratio of the high-frequency signal receiver will be explained in the case that the input signal contains the desired signal having the level (Psi) or contains the desired signal and a signal having its level smaller than the level (Psi) adjacent to the desired signal, and that the level (Psi) of the desired signal is larger than −70 dBm. In equation 5, the voltage V(AGC1) output from the AGC controller 109 is set to a certain voltage ranging from 0V to 3V, and the voltage V(AGC2) output from the AGC controller 112 is controlled to be 0V. The gain of the AGC circuit 102 is thus determined by the voltage V(AGC1) output from the AGC controller 109 similarly to the conventional receiver.

More particularly, in the range 302 of the level of the input signal larger than −70 dBm in FIG. 3, the AGC circuit 102 has the gain $G_1$ controlled to be smaller in equation 3. Accordingly, the noise factor $F_2$ of the mixer 108 and the noise factor $F_3$ of the succeeding circuits including the filter 110 does not become negligible. The noise factor (F) of the high-frequency signal receiver increases according to an increase of the input signal as shown by a line 303 in FIG. 3.

In a range 402 shown in FIG. 4 of the level (Psi) of the desired signal larger than −70 dBm, the noise factor (F) of the high-frequency signal receiver increases, i.e., declines according to the increase of the level (Psi) of the desired signal throughout the range 302 shown in FIG. 3. This allows the C/N ratio expressed by equation 4 to remain constant as shown by a line 403.

Next, the C/N ratio of the high-frequency signal receiver will be explained in case that the level (Psi) of the desired signal remains constant, for example, at −70 dBm, and that the level of a signal adjacent to the desired signal is not higher than −70 dBm.

In equation 5, in the case that the level of the desired signal is not smaller than −70 dBm, the voltage V(AGC1) output from the AGC controller 109 is set to a voltage ranging from 3V to 0V, thus determining the gain of the AGC circuit 102 into a gain between the maximum gain and the minimum gain. The voltage V(AGC2) output from the AGC controller 112 is controlled to be 0V to determine the gain to be the minimum. Thus, since the second term in equation 5 turned to zero, the gain of the AGC circuit 102 is determined only by the voltage V(AGC1) output from the AGC controller 109 similarly to the conventional receiver.

That is, the noise factor F of the high-frequency signal receiver remains small as shown by the line 304 in FIG. 3, and the C/N ratio of the receiver is large as shown by the line 404 in FIG. 4.

Figure 5:
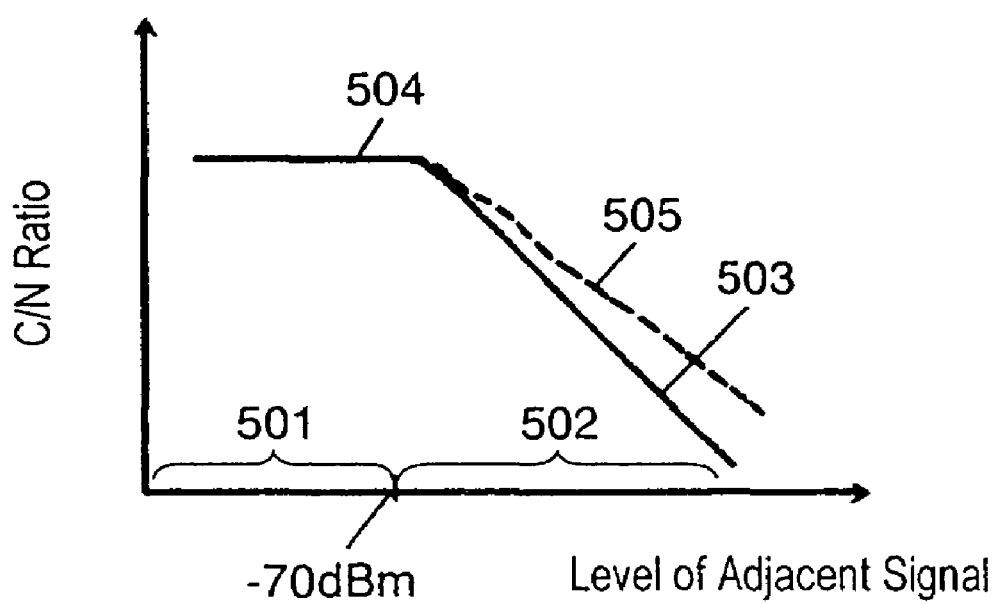
FIG. 5 illustrates the C/N ratio of the high-frequency signal receiver when the level of the desired signal is constant.

FIG. 5 illustrates the C/N ratio of the high-frequency signal receiver in relation to the level of the adjacent signal when the level of the desired signal remains at −70 dBm. A horizontal axis represents the level of the adjacent signal at an adjacent channel, and a vertical axis represents the C/N ratio of the receiver.

In a range 501 of the level of the adjacent signal not larger than −70 dBm, the desired signal having the level (−70 dBm) contributes to the control of the gain, and thus, the C/N ratio of the high-frequency signal receiver remains large as shown by a line 504 in FIG. 5. In other words, since the level of the adjacent signal is smaller than the level (Psi) of the desired signal, the adjacent signal does not affect signal-receiving adversely.

Next, the C/N ratio of the high-frequency signal receiver will be explained in case that the level (Psi) of the desired signal remains at −70 dBm and the level of the adjacent signal is larger than −70 dBm.

In Equation 5, the voltage V(AGC1) output from the AGC controller 109 is controlled to be a certain voltage in a range, for example, from 3V to 0V corresponding to a range from the maximum gain to the minimum gain of the AGC circuit 102 according to the level of the adjacent signal which larger than the level (Psi) of the desired signal. The signal output from the AGC circuit 102 is processed by the filters 110 and 115 for suppressing the adjacent signal, i.e., the interference signal. This operation allows the desired signal, which has a small level output from the AGC circuit 102, to be detected by the AGC controller 112 and to have the level controlled by the AGC circuit 111. Accordingly, the voltage V(AGC2) output from the AGC controller 112 shifts towards the maximum voltage of 3V, and the voltage V(RF12) output from the weighting circuit 104 is compensated towards the maximum voltage of 3V to increase the gain of the AGC circuit 102.

More specifically, the gain $G_1$ of the AGC circuit 102 is controlled to be larger by the voltage V(RF12) output from the weighting circuit 104, while the noise factor $F_1$ of the receiver decreases. Thus, according to equation 3, the noise factor F decreases, thus improving the performance of the high-frequency signal receiver. In the range 302 of the level of the desired signal larger than −70 dBm, the noise factor F shown by the line 306 in FIG. 3 decreases as compared with the noise factor (line 303) of the conventional receiver. This allows the C/N ratio of the high-frequency signal receiver expressed as equation 4 to increase according to the decrease of the noise factor F as shown by the line 505.

The level of the adjacent signal may decrease the C/N ratio and causes three-dimensional inter-modulation distortion (IM3) to interference the receiver. The former case affects the receiver and can be eliminated by the receiver of embodiment 1.

The weighing controller 105 receiving control data from the data input port 106 is arranged to separately determine the weighting factors easily from outside.

However, when the weighting factor K2 for the voltage output from the AGC controller 112 is too greater than the weighting factor K1 for the voltage output from the AGC controller 109, the voltage V(RF12) output from the weighting circuit 104 expressed as equation 5 may increase, thus causing the AGC circuit 102 to have a too large gain. Therefore, the IM3 interference in the mixer 108 affects the receiver, and therefore, the weighting factors K1 and K2 has to be determined appropriately.

As explained, regardless of any interference of the adjacent signal over the desired signal, the high-frequency signal receiver of embodiment 1 can have the improved C/N ratio through controlling the gain of the AGC circuit 102 with the use of the voltage output from the weighting circuit 104 where the level of the desired signal and the level of the adjacent signal are multiplied by the respective weighting factors before summing the voltages.

More specifically, the gain of the AGC circuit 102 can be controlled instantly and favorably based on the voltage determined according to the level of the adjacent signal for controlling the gain of the AGC circuit 111. Accordingly, an interference signal adjacent to the desired signal in the input signal can be eliminated. This operation allows the receiver to receive the signal stably during movement in which ambient conditions varies in time, and allows the high-frequency signal receiver of embodiment 1 to be used for mobile communications at high speeds.

The high frequency signal to be received may be of either an analog form or a digital form with equal success.

Embodiment 2

A high-frequency signal receiver according to exemplary embodiment 2 of the invention will be described. While interference signals adjacent to a desired signal in an input signal may include an adjacent signal and an adjacent-adjacent signal, the adjacent signal will be considered in the following description.

The high-frequency signal receiver of embodiment 1 shown in FIG. 1 includes the weighting circuit 104 arranged to receive a voltage output from the AGC controller 112. The high-frequency signal receiver of embodiment 2 is shown in FIG. 2 further includes a weighting circuit 204 for receiving a voltage output from an AGC controller 221.

Since equations 3, 4 and FIGS. 3 to 5 are applicable to the receiver of embodiment 2, their description is omitted.

Figure 2:
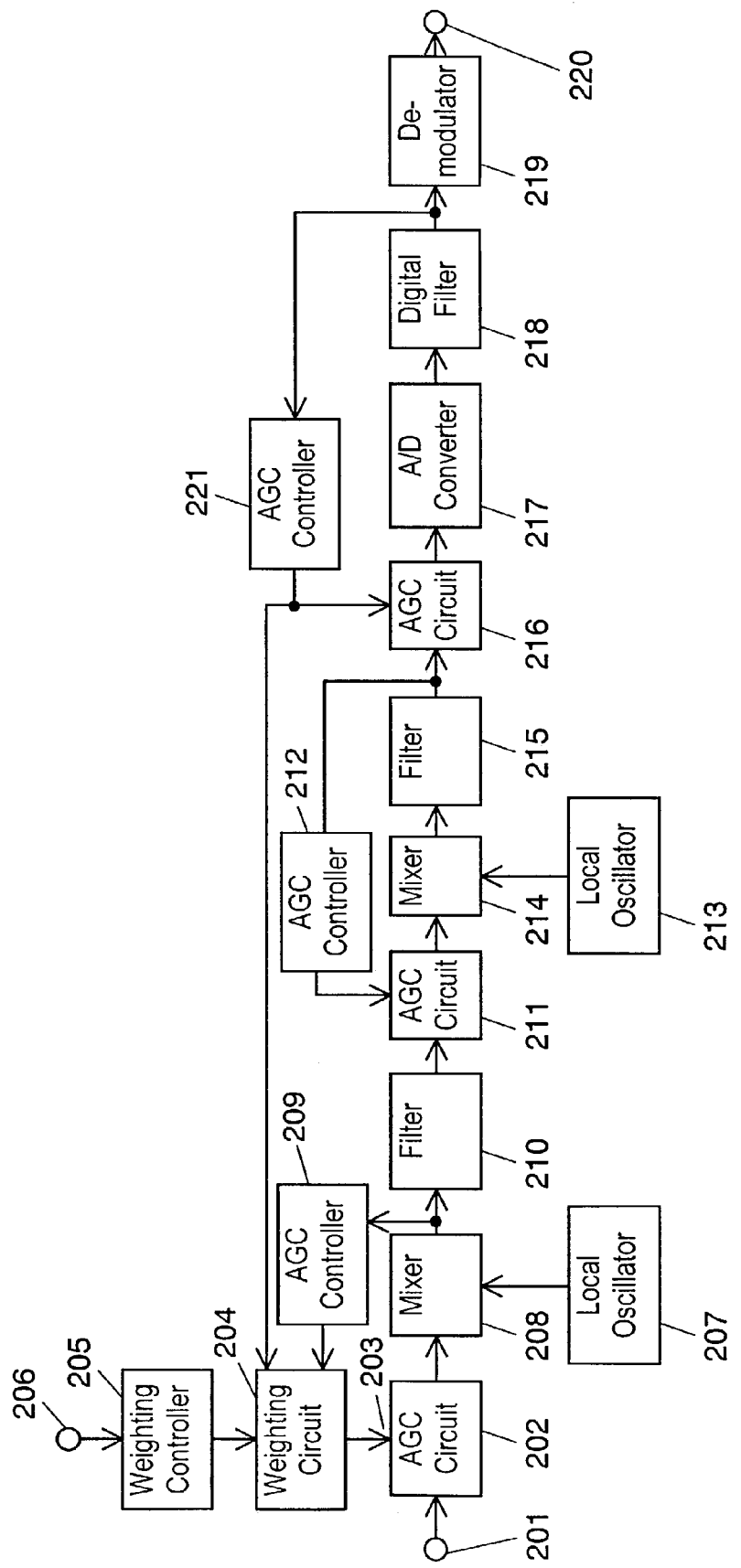
FIG. 2 is a block diagram of a high-frequency signal receiver according to exemplary embodiment 2 of the invention.

FIG. 2 is a block diagram of the high-frequency signal receiver of embodiment 2. A high-frequency signal is received at an input port 201 and transferred to an AGC circuit 202 which acts as a variable gain amplifier for controlling a gain of the input signal to obtain a desired level of the signal. A mixer 208 receives a signal output from the AGC circuit 202 and a signal output from a local oscillator 207. A signal output from the mixer 208 is fed to a filter 210. The signal output from the mixer 208 is also received by an AGC controller 209. A signal output from the filter 210 is transferred to an AGC circuit 211. A mixer 214 receives a signal output from the AGC circuit 211 and a signal output from a local oscillator 213. A filter 215 receives a signal output from the mixer 214. The AGC controller 212 receives a signal output from the filter 215 or the signal output from the mixer 214, and outputs a signal to a control port for controlling a gain of the AGC circuit 211. The signal output from the filter 215 is transferred to an AGC circuit 216. A signal output from the AGC circuit 216 is received by an A/D converter 217. A signal output from the A/D converter 217 is fed to a digital filter 218. A demodulator 219 receives a signal output from the digital filter 218 and outputs a signal through an output port 220. The signal output from the digital filter 218 is also fed to an AGC controller 221, and is used for controlling the gain of the AGC circuit 216. A weighting circuit 204 receives respective voltages output from the two AGC controllers 209, 221 and control data through a data input port 206, and outputs a signal to a gain control port 203 of the AGC circuit 202. A weighting controller 205 is arranged responsive to control data from a data input port 206 for supplying a control signal to the weighting circuit 204.

In the high-frequency signal receiver of embodiment 2, the mixer 208 outputs a first intermediate frequency which is higher than the frequency of the input signal, and the mixer 214 outputs a second intermediate frequency which is lower than the frequency of the input signal. When the level of the high-frequency signal received at the input port 201 is larger than, e.g. −70 dBm, the gain of the AGC circuit 202 is controlled. When the level is not larger than −70 dBm, the gain of the AGC circuit 211 is controlled, and the gain of the AGC circuit 216 is controlled.

It is assumed that the high-frequency signal received at the input port 201 has a frequency ranging from 90 MHz to 770 MHz. The high-frequency signal is amplified by the AGC circuit 202 and transferred to the mixer 208 mixing the amplified signal and the signal output from the local oscillator 207 to produce a signal at the first intermediate frequency signal at, e.g. 1200 MHz which is then received by the AGC controller 209. The signal output from the mixer 208 includes signals, other than a desired signal, suppressed by the filter 210.

The signal output from the filter 210 is amplified by the AGC circuit 211 having a gain controlled by the AGC controller 212 and transferred to the mixer 214 mixing the amplified signal and an oscillation signal from the local oscillator 213 to produce a signal at the second intermediate frequency signal at, e.g. 4 MHz. The signal at the second intermediate frequency includes the signals, other than the desired signal, further suppressed by the filter 215.

The signal at the second intermediate frequency of 4 MHz output from the filter 215 is amplified by the AGC circuit 216. A signal output from the AGC circuit 216 is converted into a digital form by the A/D converter 217 and includes signals, other than the desired signal, suppressed by the digital filter 218 before received by the demodulator 219. A signal output from the demodulator 219 is then output through the output port 220.

The signal output from the digital filter 218 is also supplied to the AGC controller 221. The controller 221 supplies a control voltage to the AGC circuit 216 for determining the gain of the AGC circuit 216 in order to maintain the level of the signal received by the demodulator 219 in constant. The noise factor (F) of the high-frequency signal receiver of this embodiment is expressed as:

$$F = F_1 + \frac{F_2 - 1}{G_1} + \frac{F_3 - 1}{G_1 \cdot G_2} + \ldots \quad \text{(Equation 6)}$$

where

"$G_1$: The gain of the AGC circuit 202, $F_2$: A noise factor of the mixer 208, $G_2$: A total gain of the mixer 208 and the filter 210, and $F_3$: A noise factor of succeeding circuits including the AGC circuit 211"

A carrier-to-noise (C/N) ratio of the high-frequency signal receiver is expressed as $$\frac{C}{N} = \frac{Psi}{kTB(F-1)} \quad \text{(Equation 7)}$$

where

Psi: The level of the desired signal (W),
k: The Boltzmann constant, $1.38 \times 10^{-23}$ (J/K),
T: An ambient temperature (K), and
B: A frequency range of the desired signal (Hz).

In equation 7, the C/N ratio of the receiver is mainly determined by the level (Psi) of the desired signal, the nouse factor (F), and the frequency range (B) of the desired signal. A voltage V(RF13) output from the weighting circuit 204 is expressed as:

$$V(RF13) = K3 \times V(AGC1) + K4 \times V(AGC3) \quad \text{(Equation 8)}$$

where

V(AGC1): The voltage output from the AGC controller 209,
K3: A weighting factor for the voltage V(AGC1) in the weighting circuit 204,
V(AGC3): The voltage output from the AGC controller 221, and
K4: A weighting factor for the voltage V(AGC3) of the weighting circuit 204.

According to embodiment 2, the gains of the AGC circuits 202 and 216 becomes maximum when each of the voltages V(AGC1), V(AGC3), and V(RF13) is 3 V. The gain becomes minimum when each of the voltages is 0V.

The level of the signal output from the mixer 208 is determined by weighting the voltage V(AGC1) output from the AGC controller 209 which receives the level of the desired signal and the level of the adjacent signal and the voltage V(AGC3) output from the AGC controller 221 which receives the desired signal and the adjacent signal, i.e., an interference signal suppressed sufficiently by the filters 210, 215 and the digital filter 218.

The desired signal received by the AGC controller 221 is significantly separated from the interference components, the level of the desired signal in the signal V(RF13) output from the weighting circuit 204 can be detected accurately, thus allowing the high-frequency signal receiver of embodiment 2 to be receive less interference of the adjacent signal, i.e., a signal reception error than that of embodiment 1.

The weighting factors in the weighting circuit 204 can easily be determined by the control data supplied through the data input port 206.

If the weighting factor K4 for the voltage V(AGC3) output from the AGC controller 221 is excessively greater than the weighting factor K3 for the voltage V(AGC1) output from the AGC controller 209 in the weighting circuit 204, the voltage V(RF13) output from the weighting circuit 204 expressed as equation 8 becomes large, thus allowing the AGC circuit 202 to have a too large gain.

As described, the weighting circuit 204 performs the above operation to weight and sum respective voltages output from the AGC controllers 209 and 221 for reducing the signal reception error regardless of the input signal containing the interference signals including the signal adjacent to the desired signal. Since the gain of the AGC circuit 202 is controlled with the control voltage supplied from the weighting circuit 204, the gain is determined appropriately for eliminating the interference signal and increasing the C/N ratio. Accordingly, the high-frequency signal receiver of embodiment 2 eliminates the interference signal and reduces the reception error caused by the adjacent signal in the input signal more than the receiver of embodiment 1, thus receiving the desired signal stably.

The weighting circuit 204 outputs the sum of the weighted voltages output from the AGC controllers 209 and 221 for determining the gain of the AGC circuit 202 for determining the gain of the AGC circuit instantly. Since receiving the signal reception stably during movement in which ambient conditions varies in time, the high-frequency signal receiver of embodiment 2 is suitable for mobile communications under movement at high speeds.

The AGC controller 212 of the receiver shown in FIG. 2 receives the signal output from the filter 215, and instead, may directly receive the signal output from the mixer 214.

Embodiment 3

A high-frequency signal receiver according to exemplary embodiment 3 of the present invention will be described. While interference signals adjacent to a desired signal in an input signal may include an adjacent signal and an adjacent-adjacent signal, the adjacent signal will be considered in the following description.

While the high-frequency signal receiver of embodiment 2 shown in FIG. 2 includes the single weighting circuit 204, the high-frequency signal receiver of embodiment 3 includes two weighting circuits 1105 and 1110. The weighting circuit 1110 is arranged to receive a voltage output from an AGC controller 1112 and a voltage output from an AGC controller 1121.

Figure 6:
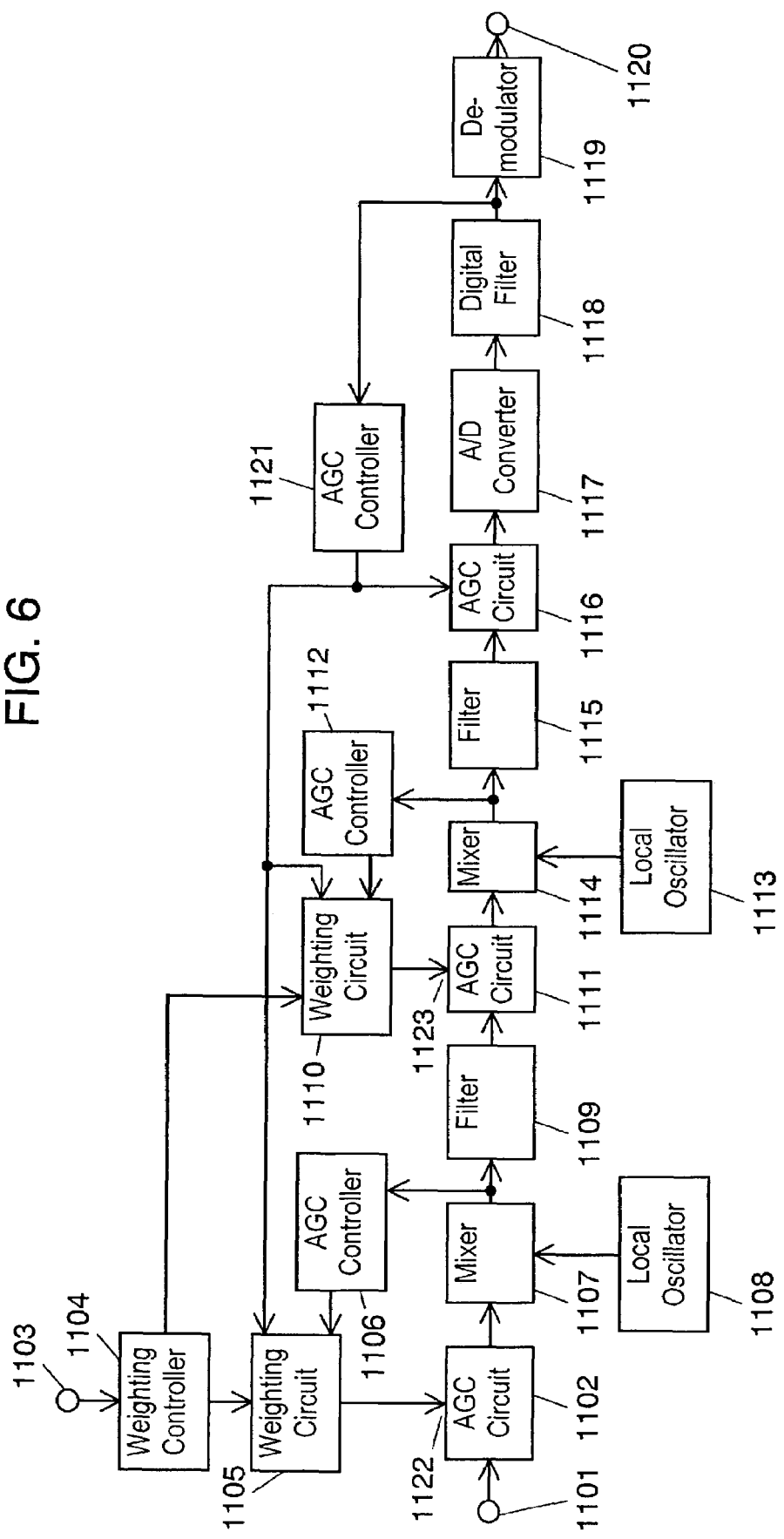
FIG. 6 is a block diagram of a high-frequency signal receiver according to exemplary embodiment 3 of the invention.

FIG. 6 is a block diagram of the high-frequency signal receiver of embodiment 3. A high-frequency signal is received at an input port 1101 and transferred to an AGC circuit 1102 which acts as a variable gain amplifier having its gain to obtain a desired level of the signal. A mixer 1107 receives a signal output from the AGC circuit 1102 and a signal output from a local oscillator 1108. A signal output from the mixer 1107 is supplied to a filter 1109. The signal output from the mixer 1107 is also received by an AGC controller 1106 for determining the gain of the AGC circuit 1102. A signal output from the filter 1109 is transferred to an AGC circuit 1111 having its gain to control the level of the signal. A mixer 1114 receives a signal output from the AGC circuit 1111 and a signal output from a local oscillator 1113. A filter 1115 receives a signal output from the mixer 1114. The AGC controller 1112 receives the signal output from the mixer 1114. The signal output from the filter 1115 is transferred to an AGC circuit 1116 having its gain to control the level of the signal. A signal output from the AGC circuit 1116 is received by an A/D converter 1117. A signal output from the A/D converter 1117 is supplied to a digital filter 1118. A demodulator 1119 receives a signal output from the digital filter 1118 and outputs a signal through an output port 1120. The signal output from the digital filter 1118 is also supplied to the AGC controller 1121 using the signal for controlling the gain of the AGC circuit 1116. The weighting circuit 1105 receives respective voltages output from the AGC controllers 1106 and 1121, and outputs s signal to a gain control port 1122 for determining the gain of the AGC circuit 1102. The weighting circuit 1110 receives respective voltages output from the AGC controllers 1112 and 1121, and outputs a signal to a gain control port 1123 for determining the gain of the AGC circuit 1111.

In the high-frequency signal receiver of embodiment 3, the mixer 1107 outputs a first intermediate frequency which is higher than the frequency of the input signal, and the mixer 1114 outputs a second intermediate frequency which is lower than the frequency of the input signal.

When the level of the high-frequency signal received at the input port 1101 is larger than, e.g. −70 dBm, the gain of the AGC circuit 1102 is controlled. When the level is not larger than −70 dBm, the gain of the AGC circuit 1111 is controlled, and the gain of the AGC circuit 1116 is controlled.

It is assumed that the high-frequency received at the input port 1101 ranges from 90 MHz to 770 MHz. The high-frequency signal is amplified by the AGC circuit 1102 and transferred to the mixer 1107 mixing the signal and the signal output from the local oscillator 1108 to produce a signal at the first intermediate frequency signal of, e.g. 1200 MHz which is then received by the AGC controller 1106. The signal output from the mixer 1107 includes signals, other than the desired signal, suppressed by the filter 1109.

The signal output from the filter 1109 is amplified by the AGC circuit 1111 and transferred to the mixer 1114 mixing the signal and an oscillation signal from the local oscillator 1113 to produce a signal at the second intermediate frequency of, e.g. 4 MHz. The signal at the second intermediate frequency includes signals, other than the desired signal, suppressed by the filter 1115 and amplified by the AGC circuit 1116 having its gain controlled by the AGC controller 1121.

The signal at the second intermediate frequency of 4 MHz output from the filter 1115 is amplified by the AGC circuit 1116. A signal output from the AGC circuit 1116 is converted into a digital form by the A/D converter 1117 and includes signal, other than the desired signal, further suppressed by the digital filter 1118 before received by the demodulator 1119. A demodulated signal from the demodulator 1119 is output through the output port 1120.

The signal output from the digital filter 1118 is also supplied to the AGC controller 1121. The controller supplies a control voltage to the AGC circuit 1116 for determining the gain of the AGC circuit 1116 to maintaining the level of the signal received by the demodulator 1119 in constant.

Control data received at the data input port 1103 is transferred to the weighting controller 1104 using the data for determining the weighting factors of the weighting circuit 1105 and the weighting factors of the weighting circuit 1110 separately. This operation allows the weighting operation to be adapted arbitrarily for the level of the interference signal (i.e., the signal output from the AGC controller 1106) and the level of the desired signal (i.e., the signal output from the AGC controller 1121). Accordingly, the signals output from the mixers 1107 and 1114 can be set to a desired level. The noise factor (F) of the high-frequency signal receiver of this embodiment is expressed as:

$$F = F_1 + \frac{F_2 - 1}{G_1} + \frac{F_3 - 1}{G_1 \cdot G_2} + \ldots \quad \text{(Equation 9)}$$

where

"$G_1$: The gain of the AGC circuit 1102, $F_2$: A noise factor of the mixer 1107, $G_2$: A total gain of the mixer 1107 and the filter 1109, and $F_3$: A noise factor of succeeding circuits including the AGC circuit 1111"

A carrier-to-noise (C/N) ratio of the high-frequency signal receiver is expressed as $$\frac{C}{N} = \frac{Psi}{kTB(F-1)} \quad \text{(Equation 10)}$$

where
Psi: The level of the desired signal (W),
k: The Boltzmann constant, $1.38 \times 10^{-23}$ (J/K),
T: An ambient temperature (K), and
B: A frequency range of the desired signal (Hz).

A voltage V(RF13) output from the weighting circuit 1105 is expressed as:

$$V(RF13) = K5 \times V(AGC1) + K6 \times V(AGC3) \quad \text{(Equation 11)}$$

where
V(AGC1): The voltage output from the AGC controller 1106,
K5: A weighting factor for the voltage V(AGC1) in the weighting circuit 1105,
V(AGC3): The voltage output from the AGC controller 1121, and
K6: A weighting factor for the voltage V(AGC3) of the weighting circuit 1105.

The adjacent signal can significantly be suppressed by the filters 1109, 1115, and the digital filter 1118. Accordingly, respective contribution rates of the desired signal and the adjacent signal to the signal output from the mixer 1107 can be determined by separately weighting the voltage V(AGC1) output from the AGC controller 1106 which receives both the desired signal having the level (Psi), and the adjacent signal and the voltage V(AGC3) output from the AGC controller 1121 which receives substantially only the desired signal. The voltage V(IF23) output from the weighting circuit 1110 is expressed as:

$$V(IF13) = K7 \times V(AGC2) + K8 \times V(AGC3) \quad \text{(Equation 12)}$$

where
V(AGC2): The voltage output from the AGC controller 1112,
K7: A weighting factor for the voltage V(AGC2) in the weighting circuit 1110,
V(AGC3): The voltage output from the AGC controller 1121, and
K8: A weighting factor for the voltage V(AGC3) of the weighting circuit 1110.

The adjacent signal can significantly be suppressed by the filters 1109, 1115 and the digital filter 1118. Accordingly, respective contribution rates of the desired signal and the adjacent signal to the signal output from the mixer 1114 can be determined by separately weighting the voltage V(AGC2) output from the AGC controller 1112 which receives both the desired signal of the level (Psi) and the adjacent signal suppressed by the filter 1109 and the voltage V(AGC3) output from the AGC controller 1121 which receives substantially only the desired signal.

According to embodiment 3, the gains of the AGC circuits 1102, 1111, and 1116 becomes maximum when each of the voltages V(AGC1), V(AGC2), and the V(AGC2) from the AGC controllers 1106, 1112, and 1121, the voltage V(RF13) from the weighting circuit 1105, and the voltage V(IF23) from the weighting circuit 1110 is 3V. The gains become minimum when the voltages are 0V. The weighting factors K5 to K8 can separately be determined to be a value ranging from 0 to 1.

In the following explanation, the weighting factors K5 and K7 is set to 1, and the weighting factors K6 and K8 is set to desired values in equations 11 and 12.

When the level of the high-frequency input signal received at the input port 1101 is larger than, e.g. −70 dBm, the gain of the AGC circuit 1102 is controlled. When the level of the high-frequency input signal is not larger than −70 dBm, the gain of the AGC circuit 1111 is controlled. Furthermore, when the level of the input signal is smaller than, e.g. −90 dBm, the gain of the AGC circuit 1116 is controlled.

The C/N ratio of the high-frequency signal receiver of this embodiment will be explained firstly when the adjacent signal, i.e., the interference signal in the input signal is small, negligible, and the level (Psi) of the desired signal is smaller than −90 dBm.

Since the level (Psi) the desired signal is smaller than −90 dBm, the voltage V(AGC1) at the first term of equation 11 is maximum, 3V, and the voltage V(AGC3) at the second term of equation 11 ranges from 0V to 3V. The voltage V(RF13), not being higher than 3V, is 3V, and therefore, the gain of the AGC circuit 1102 is determined in the same manner as the conventional receiver.

The voltage V(AGC2) at the first term of equation 12 is 3V and the voltage V(AGC3) at the second term of equation 12 ranges from 0V to 3V. The output voltage V(RF23), not being higher than 3V, is 3V, and therefore, the gain of the AGC circuit 1111 is determined in the same manner as the conventional receiver.

The C/N ratio of the high-frequency signal receiver will then be explained in case that the adjacent signal, i.e., the interference signal in the input signal is small, negligible, and the level (Psi) of the desired signal ranges from −70 dBm to −90 dBm.

Since the level (Psi) of the desired signal ranges from −70 dBm to −90 dBm, the output voltage V(AGC1) at the first term of equation 11 is controlled to 3V, and the output voltage V(AGC3) at the second term of equation 11 ranges from 0V to 3V. The output voltage V(RF13), not being higher than 3V, is 3V, and therefore, the gain of the AGC circuit 1102 is determined in the same manner as the conventional receiver.

The output voltage V(AGC2) at the first term of equation 12 is controlled to range from 0V to 3V, while the output voltage V(AGC3) at the second term of equation 12 is 0V, negligible. Since the output voltage V(IF23) is determined by the output voltage V(AGC2) at the first term, the gain of the AGC circuit 1111 is determined in the same manner as the conventional receiver.

Figure 7:
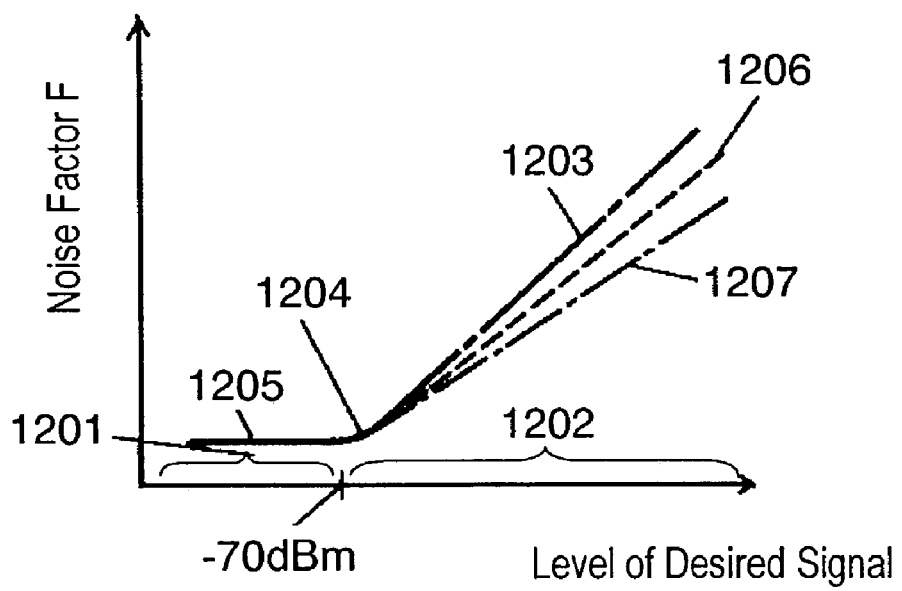
FIG. 7 illustrates a noise factor of the high-frequency signal receiver in relation to the level of a desired signal.

FIG. 7 illustrates the noise factor (F) of the high-frequency signal receiver of this embodiment in relation to the level of the desired signal. A horizontal axis represents the level of the desired signal, and a vertical axis represents the noise factor (F) of the high-frequency signal receiver. When the level (Psi) of the desired signal is in a range 1201 not higher than −70 dBm, the gain G1 of the AGC circuit 1102 becomes maximum in equation 11, and the noise factor F1 dominates. Accordingly, the noise factor (F) of the receiver is low and constant, as shown by a line 1205.

Figure 8:
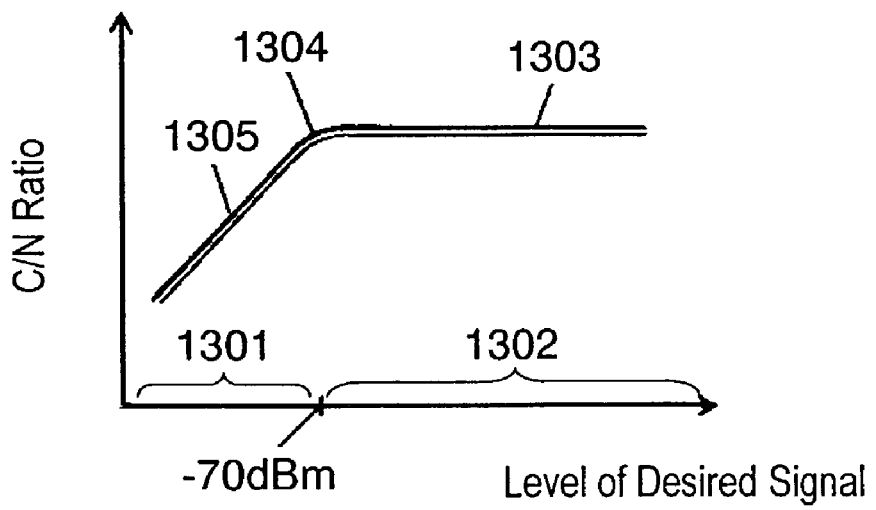
FIG. 8 illustrates a C/N ratio of the high-frequency signal receiver in relation to the level of the desired signal.

FIG. 8 illustrates the C/N ratio of the high-frequency signal receiver in relation to the level (Psi) of the desired signal. A horizontal axis represents the level (Psi) of the desired signal, and a vertical axis represents the C/N ratio of the high-frequency signal receiver. When the level (Psi) of the desire signal is in a range 1301 lower than −70 dBm, the level (Psi) of the desired signal is large as compared with the low, constant noise factor shown in FIG. 7. Accordingly, the C/N ratio expressed as equation 10 increases and is improved, as shown by a line 1305 in FIG. 8, according to an increase of the level (Psi) of the desired signal.

Next, the C/N ratio of the high-frequency signal receiver will be further explained in case that the level (Psi) of the desired signal is larger than −70 dBm, and the level of the adjacent signal is low, negligible.

Since the level (Psi) of the desired signal is larger than −70 dBm, the output voltage V(AGC1) at the first term of equation 11 ranges from 0V to 3V to control the gain of the AGC circuit 1102 to range from its minimum to maximum. Since the output voltage V(AGC2) at the second term of equation 11 is 0V which minimizes the gain of the AGC circuit thus neglisible, the output voltage V(RF13) is determined only by the output voltage V(AGC1) at the first term of equation 11. Therefore, the gain of the AGC circuit 1102 is determined in the same manner as the conventional receiver.

The output voltage V(AGC2) at the first term of equation 12 is controlled to 0V to minimize the gain of the AGC circuit, while the output voltage V(AGC2) at the second term of equation 12 is 0V which minimizes the gain. Since the output voltage V(IF23) is determined only by the output voltage V(AGC1) at the first term of equation 12, the gain of the AGC circuit 1111 is determined in the same manner as the conventional receiver.

In this case, while the input signal is in the range 1202 higher than −70 dBm in FIG. 7, the gain ($G_1$) of the AGC circuit 1102 is controlled to be smaller. Therefore, the noise factor ($F_2$) of the mixer 1107 and the noise factor ($F_3$) of the succeeding circuits including the filter 1109 become not negligible. This increases the noise factor (F) of the high-frequency signal receiver according to an increase of the level of the input signal, as shown a line 1203.

Accordingly, while the level (Psi) of the desired signal is in the range 1302 higher than −70 dBm in FIG. 8, the noise factor (F) of the high-frequency signal receiver expressed as equation 9 increases in a range of 1302 in FIG. 8, thus allowing the C/N ratio to be constant as shown by a line 1303.

Next, the C/N ratio of the high-frequency signal receiver will be further explained in case that the level (Psi) of the desired signal is constant at, e.g. −70 dBm, and the level of the adjacent signal is lower than −70 dBm.

Since the level of the desired signal is at −70 dBm, the output voltage V(AGC1) at the first term in equation 11 is controlled to 3V to set the gain of the AGC circuit to its maximum. Since the output voltage V(AGC2) at the second term of equation 11 is 0V, negligible for minimizing the gain of the AGC circuit, and since the output voltage V(RF13) is determined only by the output voltage V(AGC1) at the first term, the gain of the AGC circuit 1102 is determined in the same manner as the conventional receiver.

Further, the output voltage V(AGC2) at the first term of equation 12 is controlled to 0V for minimizing the gain of the AGC circuit, while the output voltage V(AGC3) at the second term is 0V for minimizing the gain. Since the output voltage V(IF23) is 0V, the gain of the AGC circuit 1111 is determined in the same manner as the conventional receiver.

That is, while the noise factor (F) is small as shown by a line 1204 in FIG. 7, the high-frequency signal receiver of this embodiment has an improved C/N ratio as shown by the line 1304 in FIG. 8.

Figure 9:
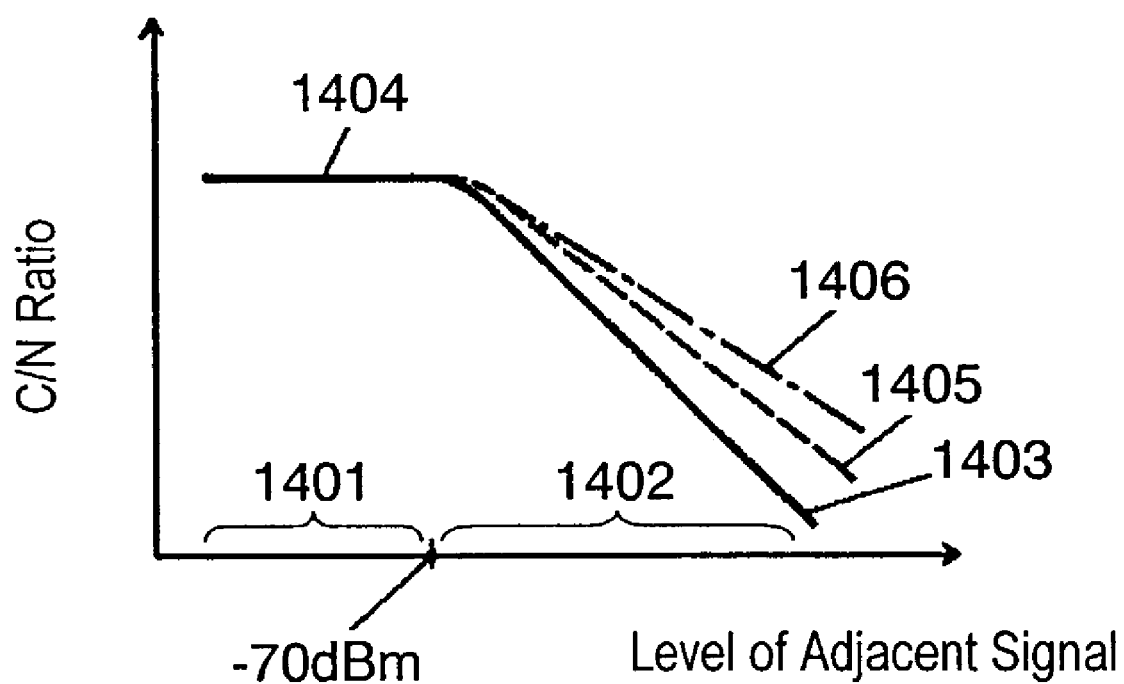
FIG. 9 illustrates the C/N ratio of the high-frequency signal receiver in relation to the level of a signal at an adjacent channel when the desired signal has a constant level.
Figure 10:
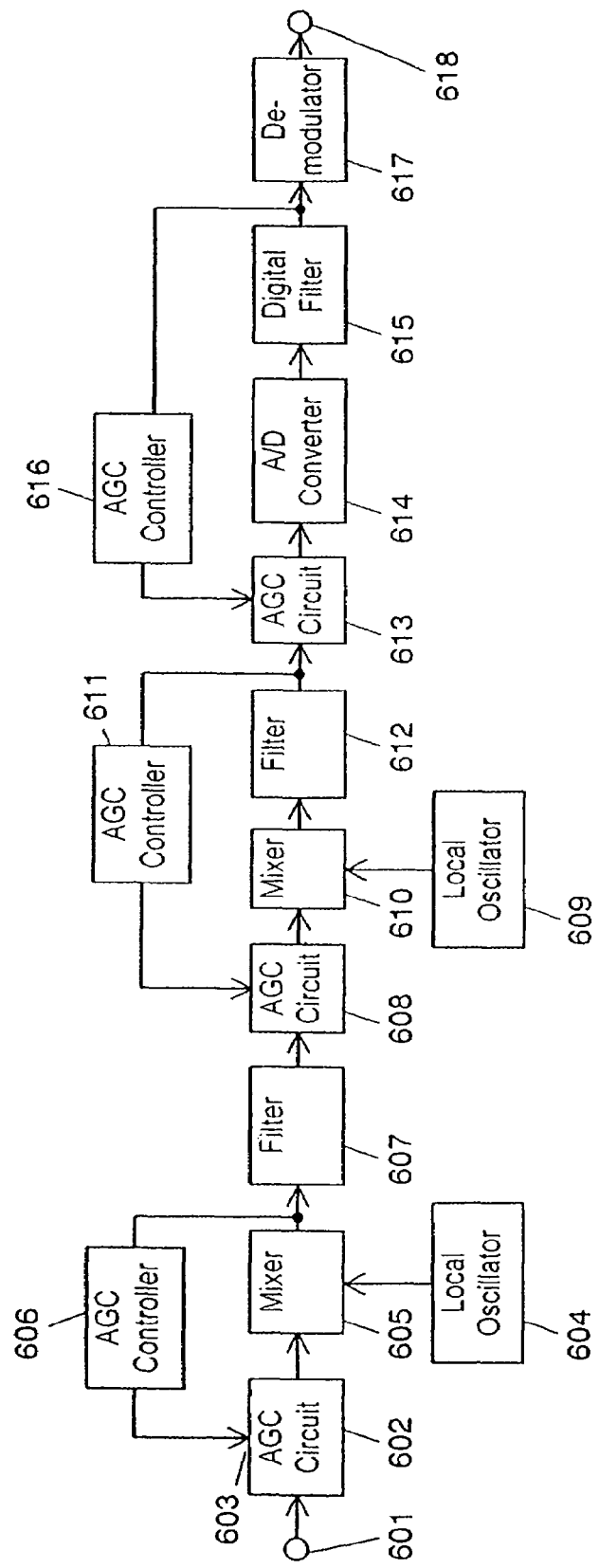
FIG. 10 is a block diagram of a conventional high-frequency signal receiver.

FIG. 9 illustrates the C/N ratio of the high-frequency signal receiver in relation to the level of the adjacent signal, in case that the level of the desired signal is −70 dBm. A horizontal axis represents the level of the adjacent signal, and a vertical axis represents the C/N ratio of the high-frequency signal receiver.

When the level of the adjacent signal is in a range 1401 lower than −70 dBm, the desired signal of the level (Psi) of −70 dBm dominates the gain control, and the C/N ratio is large, as shown by a line 1404 in FIG. 9. More specifically, since the level of the adjacent signal is smaller than that of the desired signal, the adjacent signal does not affect the receiving of the input signal, while the conventional receiver affects it.

Next, the C/N ratio of the high-frequency signal receiver will be explained in case that the level (Psi) of the desired signal is constant at −70 dBm, and the level of the adjacent signal in range 1402 is larger than −70 dBm.

The output signal V(AGC1) at the first term of equation 11 varies from 3V to 0V depending on the level of the adjacent signal, which is larger than the level (Psi) of the desired signal, for determining the gain of the AGC circuit 1102. The AGC circuit 1102 outputs the desired signal having the level (Psi) being small and the adjacent signal having a smaller level. Since the adjacent signal in the output signal of the AGC circuit 1102 is eliminated by the filters 1109, 1115 and the digital filter 1118, only the desired signal having the small level (Psi) is extracted by the AGC controller 1121. This operation allows the voltage V(AGC3) at the second term of equation 11 to be 3V for maximizing the gain of the AGC circuit.

As described, the voltage V(AGC1) at the first term of equation 11 is nearly 0V, and the voltage V(AGC3) at the second term of equation 11 is 3V for maximizing the gain. Accordingly, the control voltage V(RF13) for increasing the gain of the AGC circuit 1102 can be compensated by optimizing the weighting factors K5 and K7.

Since the gain is increased by the control voltage V(RF13) expressed as equation 11, the AGC circuit 1102 outputs the desired signal having the small level and the adjacent signal. These signals are transferred via the mixer 1107 and the filter 1109 suppressing the adjacent signal before the signal is received by the AGC circuit 1111.

The output voltage V(AGC2) at the first term of equation 12 varies from 3V to 0V for determining the gain from the maximum to the minimum depending on the level of the adjacent signal which is higher than the level of the desired signal. This allows the AGC circuit 1111 to have its gain controlled and to output the desired signal having the small level (Psi) and the adjacent signal having the smaller level. Since the adjacent signal from the AGC circuit 1111 is eliminated the filter 1115 and the digital filter 1118, only the desire signal having the small level (Psi) is extracted by the AGC controller 1121. Accordingly, the voltage V(AGC3) output from the AGC controller 1121 at the second term of equation 12 is 3V for maximizing the gain of the AGC circuit.

Since the output voltage V(AGC2) at the first term of equation 12 ranges from 0V to 3V depending on the level of the adjacent signal, the output signal V(AGC3) at the second term of equation 12 is 3V for maximizing the gain. Accordingly, the control voltage V(IF23) expressed as equation 12 for increasing the gain of the AGC circuit 1111 can be compensated by optimizing the weighting factors K7 and K8 of the weighting circuit 1110 for the output voltages V(AGC2) and V(AGC3), respectively.

When the weighting factor K6 is greater than the weighting factor K5 in equation 11, the output voltage V(RF13) expressed as equation 11 becomes too large to optimize the gain of the AGC circuit 1102. As the result, the mixer 1107 may be interrupted by IM3 related interference. Thus, the weighting factors K5 and K6 have to be determined appropriately.

Also, when the weighting factor K8 for the voltage output from the AGC controller 1121 in the weighting circuit 1110 is excessively larger than the weighting factor K7 for the voltage output from the AGC controller 1112, the output voltage V(IF23) expressed as equation 12 increases, thus causing the AGC circuit 1111 to produce a excessively-large gain. As the result, the mixer 1114 may be interrupted by IM3 related interference. The weighting factors K7 and K8 have to be determined appropriately.

As described, the gain ($G_1$) of the AGC circuit 1102 can be controlled to increase, thus minimizing the noise factor ($F_1$) of the AGC circuit 1102 even when the level of the adjacent signal is larger than the level (Psi) of the desired signal. Accordingly, the noise factor (F) of the high-frequency signal receiver expressed as equation 11 can favorably decrease. When the level of the input signal is in the range 1202 higher than −70 dBm as shown in FIG. 7, the noise factor (F) decreases as shown by the line 1206 as compared with the line 1203 of the conventional receiver. Also, as apparent from equation 12, the C/N ratio of the high-frequency signal receiver is improved according to the decrease of the noise factor (F). In FIG. 9, the improved C/N ratio is shown by the line 1405, while the C/N ratio of the conventional receiver is shown by the line 1403.

Moreover, since the gain ($G_2$) of the AGC circuit 1111 is controlled to be large according not only to equation 12 but also to equation 11, the noise factor (F) of the high-frequency signal receiver further decreases and thus become better as shown by equation 11. When the input signal is in the range 1202 higher than −70 dBm shown in FIG. 7, the noise factor (F) shown by the line 1207 become smaller than the noise factor shown by the line 1206 according to only equation 11.

As apparent from Equation 12, the C/N ratio of the high-frequency signal receiver can further be improved according to the decrease of the noise factor (F). In FIG. 9, the C/N ratio is shown by a line 1406, while the C/N ratio applied only to equation 11 is shown by a line 1405.

The weighting circuit 1105 can easily be controlled by the weighting controller 1104 receiving desired control data via the data input port 1103 from outside.

As described, the voltage V(RF13) output from the weighting circuit 1105 is determined by multiplying the levels of the desired signal and the adjacent signal by weighting factors, respectively, and summing the multiplied levels controls the gain of the AGC circuit 1102 even when the input signal includes the desired signal and the large adjacent signal. In addition, the voltage V(IF23) output from the weighting circuit 1110 determined by multiplying the levels of the desired signal and the adjacent signal by weighting factors and by summing the multiplied levels controls the gain of the AGC circuit 1111. Accordingly, the high-frequency signal receiver of embodiment 3 can further be improved in the C/N ratio, and thus receives signals stably.

The weighting circuit 1105 is arranged to weight and sum the voltages from the AGC controllers 1106 and 1121 and weighting circuit 1110 is arranged to weight and sum the voltages output from the AGC controllers 1112 and 1121. Accordingly, both the AGC circuits 1102 and 1111 have their gains appropriately controlled by the voltages for controlling the gains output from the weighting circuits 1105 and 1110.

As the result, the high-frequency signal receiver of embodiment 3 is further improved in performance against signal interference.

Since the voltage V(AGC3) output from the AGC controller 1121 for controlling the gain is determined depending on the level of the adjacent interference signal carried adjacent to the desired signal, the gains of the AGC circuits 1102 and 1111 can be controlled appropriately. Receiving signals stably during movement in which ambient conditions vary in time, the high-frequency signal receiver of embodiment 3 can favorably be used for mobile communications with movement at high speeds.

According to embodiments 1 to 3, while the frequency of the signal output from each of the mixers 108, 208, and 1107 is higher than that of the input signal, the frequency may be higher than that of the input signal with equal effects The receiver according to embodiments 1 to 3 may employ a direct conversion instead of the mixers 114, 214, and 1114 with equal effects.

The AGC circuits, the mixers, the local oscillators, the weighting circuit(s), the AID converter, and the digital filter according to embodiments 1 to 3 may be integrated in a single package. This arrangement allows the high-frequency signal receiver to have a reduced overall size and significantly-reduced number of production steps as simplified in the management of components.

What is claimed is:

1. A high-frequency signal receiver comprising:
   a first variable gain amplifier for amplifying a high frequency signal input thereto;
   a first local oscillator;
   a first mixer for mixing a signal output from said first variable gain amplifier and a signal output from said first local oscillator;
   a first filter for receiving a signal output from said first mixer;
   a first gain controller for outputting a voltage according to said signal output from said first mixer;
   a second variable gain amplifier for amplifying a signal output from said first filter;
   a second local oscillator;
   a second mixer for mixing a signal output from said second variable gain amplifier and a signal output from said second local oscillator;
   a second filter for receiving a signal output from said second mixer;
   a second gain controller for outputting a voltage which determines a gain of said second variable gain amplifier according to a signal output from said second filter;
   a weighting circuit for weighting and summing said voltage output from said first gain controller and said voltage output from said second gain controller for controlling a gain of said first variable gain amplifier; and
   a weighting controller for determining respective weighting factors for said voltage output from said first gain controller and said voltage output from said second gain controller which are used in said weighting circuit.

2. The high-frequency signal receiver according to claim 1, wherein said weighting controller determines said respective weighting factors according to control data input thereto.

3. The high-frequency signal receiver according to claim 1, further comprising
   a package arranged for accommodating said first variable gain amplifier, said first mixer, said first local oscillator, said first gain controller, and said weighting circuit therein.

4. A high-frequency signal receiver comprising:
   a first variable gain amplifier for amplifying a high frequency signal input thereto;
   a first local oscillator;
   a first mixer for mixing a signal output from said first variable gain amplifier and a signal output from said first local oscillator;
   a first filter for receiving a signal output from said first mixer;
   a first gain controller for outputting a voltage according to said signal output from said first mixer;
   a second variable gain amplifier for amplifying a signal output from said first filter;
   a second local oscillator;
   a second mixer for mixing a signal output from said second variable gain amplifier and a signal output from said second local oscillator;
   a second filter for receiving a signal output from said second mixer;
   a second gain controller for outputting a voltage which determines a gain of said second variable gain amplifier according to one of a signal output from said second filter and said signal output from said second mixer;
   a third variable gain amplifier for amplifying said signal output from said second filter;
   a third filter for receiving a signal output from said third variable gain amplifier;
   a third gain controller for outputting a voltage which determines a gain of said third variable gain amplifier according to a signal output from said third filter; and
   a weighting circuit for weighting and summing said voltage output from said first gain controller and said voltage output from said third gain controller for controlling a gain of said first variable gain amplifier.

5. The high-frequency signal receiver according to claim 4, wherein said third filter comprises:
   an analog-to-digital (A/D) converter for A/D-converting said signal output from said third variable gain amplifier; and
   a digital filter for receiving a signal output from said A/D converter.

6. The high-frequency signal receiver according to claim 4, further comprising
   a demodulator for receiving said signal output from said third filter.

7. The high-frequency signal receiver according to claim 4, further comprising
   a weighting controller for determining respective weighting factors for said voltage output from said first gain controller and said voltage output from said third gain controller which are used in said weighting circuit.

8. The high-frequency signal receiver according to claim 7, wherein said weighting controller determines said respective weighting factors according to control data input thereto.

9. The high-frequency signal receiver according to claim 4, further comprising
a package arranged for integrating and accommodating said first variable gain amplifier, said second variable gain amplifier, said third variable gain amplifier, said first mixer, said second mixer, said first local oscillator, said second local oscillator, said first gain controller, said second gain controller, said third gain controller, and said weighting circuit therein.

10. The high-frequency signal receiver according to claim 9, wherein said package is arranged for integrating and accommodating said third filter therein.

11. A high-frequency signal receiver comprising:
a first variable gain amplifier for amplifying a high frequency signal input thereto;
a first local oscillator;
a first mixer for mixing a signal output from said first variable gain amplifier and a signal output from said first local oscillator;
a first filter for receiving a signal output from said first mixer;
a first gain controller for outputting a voltage according to said signal output from said first mixer;
a second variable gain amplifier for amplifying a signal output from said first filter;
a second local oscillator;
a second mixer for mixing a signal output from said second variable gain amplifier and a signal output from said second local oscillator;
a second filter for receiving a signal output from said second mixer;
a second gain controller for outputting a voltage according to said signal output from said second mixer;
a third variable gain amplifier for amplifying a signal output from said second filter;
a third filter for receiving a signal output from said third variable gain amplifier;
a third gain controller for outputting a voltage which determines a gain of said third variable gain amplifier according to a signal output from said third filter;
a first weighting circuit for weighting and summing said voltage output from said first gain controller and said voltage output from said third gain controller for controlling a gain of said first variable gain amplifier; and
a second weighting circuit for weighting and summing said voltage output from said second gain controller and said voltage output from said third gain controller for controlling a gain of said second variable gain amplifier.

12. The high-frequency signal receiver according to claim 11, wherein said third filter comprises:
an analog-to-digital (A/D) converter for A/D-converting said signal output from said third variable gain amplifier; and
a digital filter for receiving a signal output from said A/D converter.

13. The high-frequency signal receiver according to claim 11, further comprising
a demodulator for receiving said signal output from said third filter.

14. The high-frequency signal receiver according to claim 11, further comprising a weighting controller for determining respective weighting factors for said voltage output from said first gain controller and said voltage output from said third gain controller which are used in said first weighting circuit, and for determining respective weighting factors for said voltage output from said second gain controller and said voltage output from said third gain controller which are used in said second weighting circuit.

15. The high-frequency signal receiver according to claim 14, wherein said weighting controller determines said weighting factors according to control data input thereto.

16. The high-frequency signal receiver according to claim 11, further comprising
a package arranged for integrating and accommodating said first variable gain amplifier, said second variable gain amplifier, said first mixer, said second mixer, said first local oscillator, said second local oscillator, said first gain controller, said second gain controller, said first weighting circuit, and said second weighting circuit therein.

17. A high-frequency signal receiver comprising:
a first variable gain amplifier for amplifying a high frequency signal input thereto;
a first local oscillator;
a first mixer for mixing a signal output from said first variable gain amplifier and a signal output from said first local oscillator;
a first filter for receiving a signal output from said first mixer;
a first gain controller for outputting a voltage according to said signal output from said first mixer;
a second variable gain amplifier for amplifying a signal output from said first filter;
a second filter having an input port coupled to an output port of said second variable gain amplifier;
a second gain controller for outputting a voltage which determines a gain of said second variable gain amplifier according to a signal output from said second filter;
a weighting circuit for weighting and summing said voltage output from said first gain controller and said voltage output from said second gain controller for controlling a gain of said first variable gain amplifier; and
a weighting controller for determining respective weighting factors for said voltage output from said first gain controller and said voltage output from said second gain controller which are used in said weighting circuit.

18. The high-frequency signal receiver according to claim 17, wherein said weighting controller determines said respective weighting factors according to control data input thereto.

19. The high-frequency signal receiver according to claim 17, further comprising
a package arranged for accommodating said first variable gain amplifier, said first mixer, said first local oscillator, said first gain controller, and said weighting circuit therein.

* * * * *

UNITED STATES PATENT AND TRADEMARK OFFICE
CERTIFICATE OF CORRECTION

PATENT NO.         : 7,187,733 B2                                         Page 1 of 1
APPLICATION NO. : 10/413652
DATED              : March 6, 2007
INVENTOR(S)        : Akira Fujishima et al.

It is certified that error appears in the above-identified patent and that said Letters Patent is hereby corrected as shown below:

<u>Title Page, Item (56) References Cited, FOREIGN PATENT DOCUMENTS</u>
Delete "JP         08288879 A      11/1996"

Signed and Sealed this

Thirty-first Day of July, 2007

JON W. DUDAS
*Director of the United States Patent and Trademark Office*